US006911873B2

(12) United States Patent
Yin et al.

(10) Patent No.: US 6,911,873 B2
(45) Date of Patent: Jun. 28, 2005

(54) DETECTION CIRCUIT AND METHOD FOR AN OSCILLATOR

(75) Inventors: Rong Yin, Coppell, TX (US); Thomas Allyn Coker, Irving, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/603,239

(22) Filed: Jun. 24, 2003

(65) Prior Publication Data

US 2004/0263267 A1 Dec. 30, 2004

(51) Int. Cl.$^7$ .............................. H03B 1/00; G01R 23/02
(52) U.S. Cl. ..................... 331/74; 331/158; 331/116 R; 331/175; 331/182; 331/172; 331/65; 324/39; 324/76; 324/681; 327/39; 327/50; 327/57
(58) Field of Search ...................... 331/74, 158, 116 R, 331/175, 182, 172, 65; 324/76, 39, 681; 327/39, 50, 57

(56) References Cited

U.S. PATENT DOCUMENTS 5,539,323 A * 7/1996 Davis, Jr. ..................... 331/65

OTHER PUBLICATIONS

Cho "Digitally–Controlled PLL with Pulse Width Detection Mechanism for Error Correction" IEEE International Solid State Circuits Conference 1997 Digest of Technical papers Feb. 6–8, 1997 pp 334–335 & 481.*

* cited by examiner

*Primary Examiner*—Michael B. Shingleton
(74) *Attorney, Agent, or Firm*—Lisa K. Jorgenson; Andre M. Szuwalski

(57) ABSTRACT

A method and circuit are disclosed for detecting the performance of an oscillator circuit. In particular, the circuit may detect a signal, such as the output of the oscillator circuit, failing to oscillate as desired. The second circuit may be capable of detecting whether the signal oscillates at a frequency that is less than a predetermined frequency. The second circuit may include timing circuits for determining whether the signal remains in a first logic state for at least a predetermined period of time and whether the signal remains in a second logic state for at least the predetermined period of time.

33 Claims, 2 Drawing Sheets

DETECTION CIRCUIT AND METHOD FOR AN OSCILLATOR

BACKGROUND OF THE INVENTION

1. Technical Field of the Invention

The present invention relates to detection circuitry for an oscillator, and particularly to a detection circuitry for detecting whether or not a signal oscillates as desired.

2. Description of the Related Art

Crystal oscillators have been used in the electronics industry for decades for providing a clock or other signal having a fixed, predetermined frequency. For certain applications, some existing crystal oscillator circuits operate at relatively low voltage and low current levels. However, these low voltage, low current oscillator circuits typically take an appreciably long time to start up and stabilize. Oscillator circuits having a relatively prolonged time to start-up and stabilize adversely affect normal system operation as well as testing of the circuitry associated with the oscillator circuits. In some instances, the oscillator circuits fail to oscillate properly at the desired frequency. What is needed, then, is a circuit that determines whether an output of an oscillator circuit is correctly oscillating.

SUMMARY OF THE INVENTION

Exemplary embodiments of the present invention overcome shortcomings in prior systems and satisfy a significant need for an oscillator circuit having detection circuitry that efficiently and effectively detects when the output signal of the oscillator circuit no longer oscillates. The detection circuitry may receive an input signal having a frequency that is a predetermined fraction of the frequency of the output of the oscillator circuit. The detection circuitry may include logic low detect circuitry for detecting whether the input signal remains in the logic low state for an appreciable period of time, and logic high circuitry for detecting whether the input signal remains in the logic high state for an appreciable period of time. The logic low detect circuitry and the logic high detect circuitry may each include a capacitor, a first charge circuit for charging the capacitor to a first voltage level and a second charge circuit for charging the capacitor to a second voltage level at a drive strength greater than the drive strength of the first charge circuit when enabled. The second charge circuit of the logic low detect circuit may be enabled when the input signal is in the logic low state, and the second charge circuit of the logic high detect circuit may be enabled when the input signal is in the logic high state. An output circuit generates an output detect signal having a value based upon the voltage appearing across the capacitors in each of the logic low detect circuitry and the logic high detect circuitry. In this way, the value of the output detect signal indicates whether the frequency of the input signal is less than a minimum predetermined frequency.

An exemplary embodiment of the present invention may be a method for detecting whether a signal is oscillating between at least two logic states, including the steps of initially placing a first voltage level across at least one first capacitive element; driving, with a first drive strength, a voltage appearing across the at least one first capacitive element towards a second voltage level; selectively driving, with a second drive strength greater than the first drive strength, the voltage across the at least one first capacitive element towards the first voltage level when the signal is in a first of the at least two logic states; and generating an output signal having a value based upon a voltage level across the at least one first capacitive element. The method may further include initially placing a third voltage level across at least one second capacitive element; driving, with a third drive strength, a voltage appearing across the at least one second capacitive element towards a fourth voltage level; selectively driving, with a fourth drive strength greater than the third drive strength, the voltage across the at least one second capacitive element towards the third voltage level when the signal is in a second of the at least two logic states, wherein the output signal has a value based upon a voltage level across the at least one second capacitive element.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
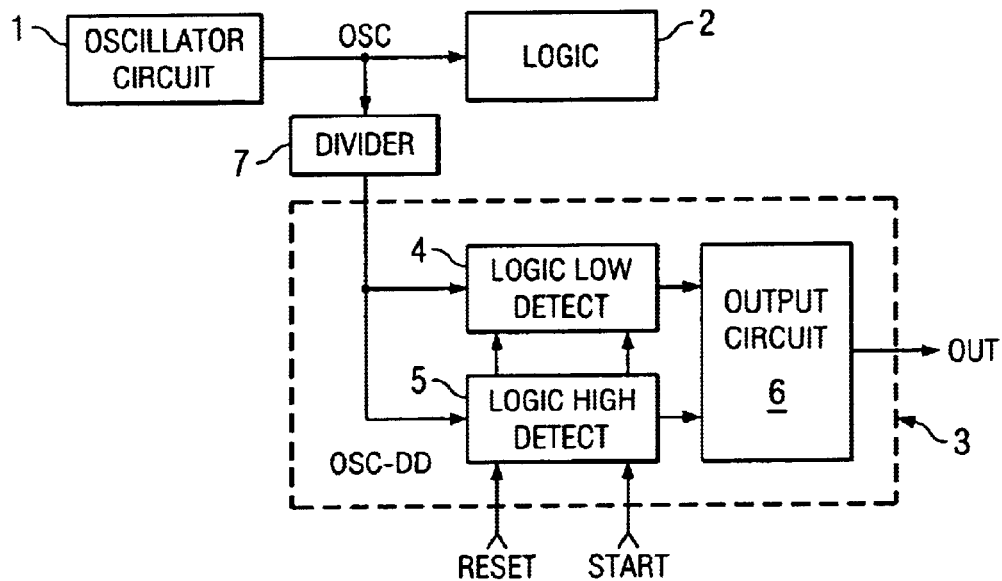
FIG. 1 is a block diagram of a system having an oscillator circuit and an oscillation detection circuit according to an exemplary embodiment of the present invention.

Referring to FIG. 1, there is shown a system utilizing oscillator circuitry according to an exemplary embodiment of the present invention. The oscillator circuitry may include an oscillator circuit 1 which generates a signal OSC adapted to oscillate between two or more logic states. Oscillator circuit 1 may be implemented in a number ways. For example, oscillator circuit 1 may be a crystal oscillator circuit having a crystal and logic inverter as is known in the art. It is understood, however, that oscillator circuit 1 may have other circuit implementations. Signal OSC may oscillate at one of any number of frequencies as desired.

The system may further include logic circuitry 2 which receives signal OSC and is adapted to perform one or more predetermined operations from utilization of signal OSC. For example, logic circuitry 2 may perform one or more synchronous operations by using signal OSC as a clock signal. It is understood that logic circuitry 2 may receive one or more other signals as inputs and generate one or more output signals.

A frequency divider 7 may receive signal OSC and generate an output having a frequency that is a predetermined fraction or "divided down" version of the frequency of signal OSC.

In an exemplary embodiment of the present invention, the system includes detection circuitry 3 having an input coupled to the output of frequency divider 7 and an output OUT. Detection circuitry 3 is adapted to detect signal OSC failing to oscillate between the two or more logic states. Detection circuitry 3 may include a logic low detect circuit 4 that receives the output of frequency divider 7 and generates an output signal having a value indicative of whether or not the output of frequency divider 7 remains in the logic low state for a relatively appreciable period of time. In addition, detection circuitry 3 may include a logic high detect circuit 5 that also receives the output of frequency divider 7 but which generates an output signal having a value indicative of whether or not the output of frequency divider 7 remains in the logic high state for a relatively appreciable period of time. Detection circuitry 3 may further include output circuitry 6 which may receive the output of logic low detect circuit 4 and logic high detect circuit 5 and generate a signal OUT which indicates whether or not the output of frequency divider 7 and thus the signal OSC remains in either the logic low state or logic high state for an undesirable prolonged period of time.

Detection circuit 3 may further receive a reset input and/or a start signal for use to start detection circuit 3. The use of the reset input and start signal will be described in greater detail below.

Figure 2:
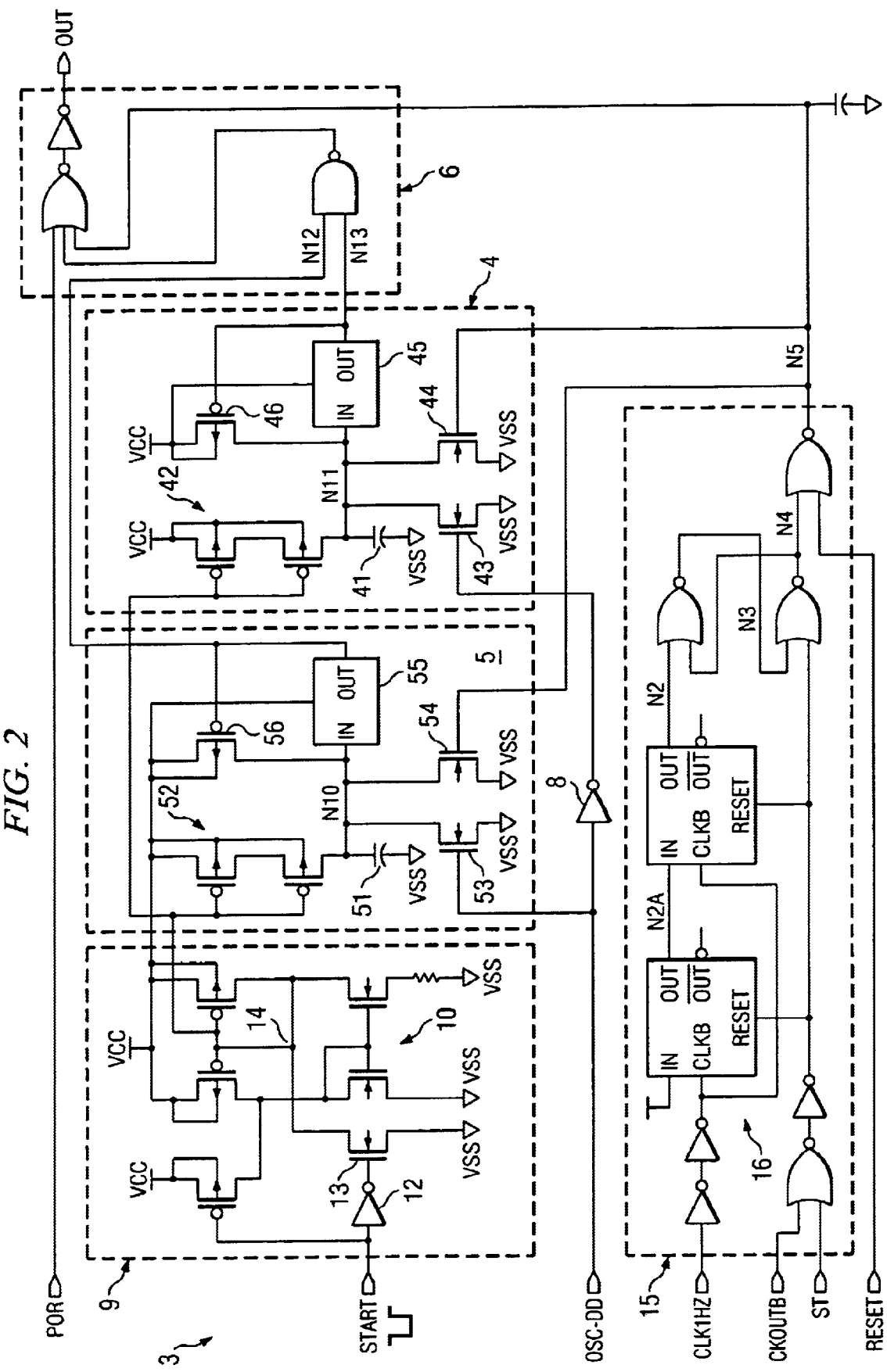
FIG. 2 is a circuit diagram of the oscillation detection circuit according to an exemplary embodiment of the present invention.

Referring to FIG. 2, there is shown a schematic of detection circuit 3 according to an exemplary embodiment of the present invention. Logic low detect circuitry 4 may include a capacitor 41 having a first plate coupled to a reference voltage, which in this exemplary embodiment is the ground potential. A current source 42 is coupled between another reference voltage, which in this exemplary embodiment is the high voltage reference Vcc, and the second plate of capacitor 42. Current source 42 is adapted to charge capacitor 41 towards Vcc. In other words, current source 42 charges capacitor 41 so that, in an absence of any other effect on capacitor 41, the voltage appearing across capacitor 41 approaches the difference between the high voltage reference Vcc and the low voltage reference (ground).

A transistor 43 may be coupled across capacitor 41. The size of transistor 43 is sized larger than the size of the transistors in current source 42, such that capacitor 41 is discharged towards the ground potential when both current source 42 and transistor 43 are activated. Transistor 43 has a control (gate) terminal coupled to the output of frequency divider 7 via logic inverter 8. In this way, capacitor 41 is discharged so that the voltage appearing across capacitor 41 approaches zero voltage during the time the value of the output of frequency divider 7 is in the logic low state. A second transistor 44 also may be coupled across capacitor 41 and have a control (gate) terminal coupled to a start signal START. Signal START is adapted to temporarily activate transistor 44 and thereby temporarily discharge capacitor 41 when oscillator circuit 1 is first enabled to cause signal OSC to oscillate, such as shortly after the system is powered up.

Logic low detect circuit 4 may further include a logic gate 45 having an input coupled to the second plate of capacitor 41 and an output having a logic state based upon the voltage appearing across capacitor 41. For example, logic gate 45 may be a logic inverter, but it is understood that logic gate 45 may perform a different logic operation. Because the voltage appearing across capacitor 41 may fluctuate around the input switching voltage of logic gate 45, logic gate 45 may be a Schmitt-triggered logic gate. The output of logic gate 45 will be more stable as a result. In order to further promote the stability of the output of logic gate 45, transistor 46 may be coupled between the high reference voltage Vcc and the second plate of capacitor 41 and have a control (gate) terminal coupled to the output of logic gate 45. In this way, when the output of logic gate 45 transitions to a logic low state, transistor 46 is activated which pulls the second plate of capacitor 41 towards the high voltage level Vcc.

Logic high detect circuit 5 may have a similar circuit implementation as the above-described circuit implementation of logic low detect circuit 4. Logic high detect circuitry 5 may include a capacitor 51 having a first plate coupled to a reference voltage, which in this exemplary embodiment is the ground potential. A current source 52 is coupled between another reference voltage, which in this exemplary embodiment is the high voltage reference Vcc, and the second plate of capacitor 51. Current source 52 is adapted to charge capacitor 51 towards Vcc. In other words, current source 52 charges capacitor 51 so that, in an absence of any other effect on capacitor 51, the voltage appearing across capacitor 51 approaches the difference between the high voltage reference Vcc and the low voltage reference (ground).

A transistor 53 may be coupled across capacitor 51. The size of transistor 53 is sized larger than the size of the transistors in current source 52, such that capacitor 51 is discharged towards the ground potential when both current source 52 and transistor 53 are activated. Transistor 53 has a control (gate) terminal coupled to the output of frequency divider 7. In this way, capacitor 51 is discharged so that the voltage appearing across capacitor 51 approaches zero voltage during the time the value of the output of frequency divider 7 is in the logic high state. A second transistor 54 also may be coupled across capacitor 51 and have a control (gate) terminal coupled to signal RESET. Signal RESET is adapted to temporarily activate transistor 54 and thereby temporarily discharge capacitor 51 when oscillator circuit 1 is first enabled to cause signal OSC to oscillate, such as shortly after the system is powered up.

Logic high detect circuit 5 may further include a logic gate 55 having an input coupled to the second plate of capacitor 51 and an output having a logic state based upon the voltage appearing across capacitor 51. For example, logic gate 55 may be a logic inverter, but it is understood that logic gate 55 may perform a different logic operation. Because the voltage appearing across capacitor 51 may fluctuate around the input switching voltage of logic gate 55, logic gate 55 may be a Schmitt-triggered logic gate. The output of logic gate 55 will be more stable as a result. In order to further promote the stability of the output of logic gate 55, transistor 56 may be coupled between the high reference voltage Vcc and the second plate of capacitor 51 and have a control (gate) terminal coupled to the output of logic gate 55. In this way, when the output of logic gate 55 transitions to a logic low state, transistor 56 is activated which pulls the second plate of capacitor 51 towards the high voltage level Vcc.

Output circuitry 6 may receive the output of logic gates 45 and 55 and generate signal OUT based upon their logic states. In particular, output circuitry 6 may include logic gates that, for example, may cause output signal OUT to be in a first logic state, such as a logic high state, when the output of either logic gate 45 or logic gate 55 is in a certain logic state, such as a logic low state. Output signal OUT may be in a second logic state, such as the logic low state, otherwise. As shown in FIG. 2, output circuitry 6 may also include other inputs for affecting the value or state of output signal OUT.

Detection circuitry 3 may include a control circuit 9 for controlling the amount of current in current sources 42 and 52 of logic low detect circuit 4 and logic high detect circuit 5, respectively. Control circuit 9 may, together with current sources 42 and 52, form a current mirror in providing current to charge capacitors 41 and 51. In particular, control circuit 9 may include circuitry 10 which forms a reference branch of the current mirror, and each current source 42 and 52 forms the mirror branch of the current mirror. In this way, the current in each current source 42 and 52 is proportional to the current in reference branch circuitry 10. The transistors in reference branch circuitry 10 operate at weak inversion so that a relatively small level of current flows in reference branch circuitry 10 as well as in current sources 42 and 52. In this way, the drive strength of current sources 42 and 52 (to charge capacitors 41 and 51, respectively) is less than the drive strength of transistors 43 and 53 (to discharge capacitors 41 and 51, respectively).

Control circuit 9 may further include circuitry for starting reference branch circuitry 10 as well as current sources 42 and 52. The circuitry may include a logic inverter 12 which receives a control signal START upon which an active low pulse occurs when the system is reset or initialized, such as at or shortly after system power-up. A transistor 13 has a control terminal coupled to the output of logic inverter 12, and conduction terminals coupled between a node 14 in control circuit 9 and ground. When control signal START transitions to the active-low state, logic inverter 12 turns on transistor 13 so as to pull node 14 to ground. This causes current to flow through the transistors in control circuit 9 and therefore through current sources 42 and 52. When control signal START returns to the active-high state, logic inverter 12 turns off transistor 13 so as to allow node 14 as well as the rest of control circuit 9 to reach their steady state conditions to conduct a predetermined current level. Current levels proportional to the current in control circuit 9 thereafter flows in current sources 42 and 52.

Detection circuitry 3 may further include reset circuitry 15 which selectively places a predetermined voltage level across capacitors 41 and 51. An output of reset circuitry 15 is coupled to the control (gate) terminal of transistors 44 and 54 such that when the output of reset circuitry 15 is in an active high state, transistors 44 and 54 are activated which discharge capacitors 41 and 51, respectively. Following the output of reset circuitry 15 returning to the inactive low state from the active high state (and following control circuit 9 being started), logic low detect circuit 4 and logic high detect circuit 5 are in a state to detect and determine whether signal OSC is oscillating. The sizes of transistors 44 and 54 may be larger (wider) than the size(s) of the transistors in current sources 42 and 52, respectively, so that capacitors 41 and 51 are discharged when the output of the reset circuitry 15 is in the active state.

As shown in FIG. 2, reset circuitry 15 may include timing circuitry 16 adapted to cause the output of reset circuitry 15 to initially be in the active high state, such as at or soon after system power-up. The timing circuitry may include two or more flip flops connected in serial relation.

Figure 3:
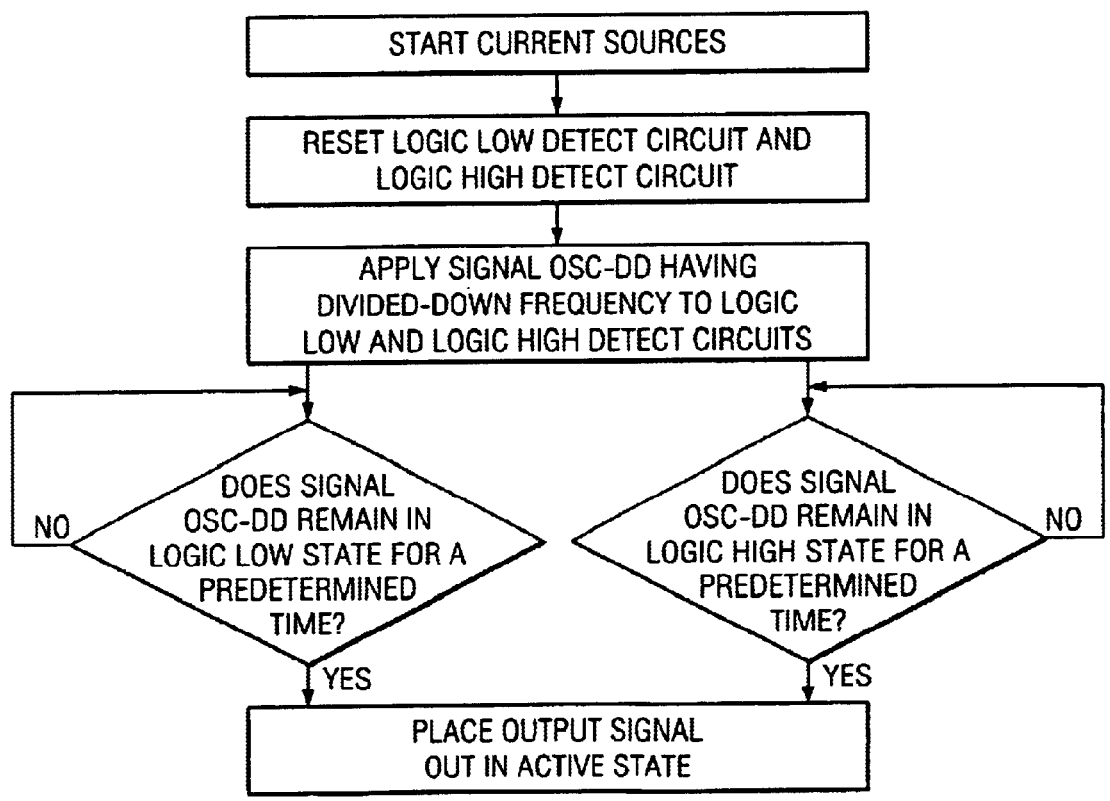
FIG. 3 is a flow chart illustrating an operation of the oscillation detection circuit of FIG. 2.

An operation of detection circuitry 3 will be described with reference to FIG. 3. Initially, current sources 42 and 52 are started by control signal START temporarily pulsing to the active-low state. At around the same time, reset circuitry 15 may cause its output signal to temporarily pulse to the active-high state, which turns on transistors 44 and 54 and thereby causes the voltage across capacitors 41 and 51, respectively, to be approximately zero volts. With the voltage across capacitors 41 and 51 being at zero volts, the output of logic gates 45 and 55 are in the logic high state, which causes output signal OUT to be in the logic low state. The above-described start and reset operations may be performed soon after the system is powered up and around the time oscillator circuit 1 generates signal OSC.

Following current sources 42 and 52 being started and capacitors 41 and 51 being discharged, logic low detect circuit 4 and logic high detect circuit 5 detect whether signal OSC is oscillating. In particular, current sources 42 and 52 charge capacitors 41 and 51, respectively. Logic low detect circuit 4 and logic high detect circuit 5 receive the output of frequency divider 7, which is a signal having a frequency that is a predetermined fraction of the frequency of signal OSC. Normally, signal OSC oscillates at a predetermined frequency, which causes the output of frequency divider 7 to oscillate a frequency that is a predetermined fraction of the predetermined frequency. When the output of frequency divider 7 is in the logic low state, transistor 43 is turned on which discharges capacitor 41 so that the charge provided by current source 42 is dissipated to ground. Capacitor 41 is discharged because transistor 43 has a greater drive strength than the drive strength of current source 42. Similarly, when the output of frequency divider 7 is in the logic high state, transistor 53 is turned on which discharges capacitor 51 so that the charge provided by current source 52 is dissipated to ground. Capacitor 51 is discharged because transistor 53 has a greater drive strength than the drive strength of current source 52.

When the output of frequency divider 7 oscillates at a high enough frequency so that capacitors 41 and 51 are regularly discharged before the voltage across each reaches the input switching voltage of logic gates 45 and 55, respectively, output signal OUT remains in the logic low state.

However, if the output of frequency divider 7 oscillates at a relatively low frequency or does not oscillate at all, logic low detect circuit 4 and/or logic high detect circuit 5 cause the output signal OUT to be in the logic high state. Specifically, at frequencies lower than a predetermined frequency, the output of frequency divider 7 allows capacitors 41 and/or 51 to charge to a voltage in excess of the input switching voltage of logic gates 45 and 55, respectively. In response, the output of logic gates 45 and 55 go to the logic low state so as to cause output signal OUT to transition to the logic high state and thereby indicate detection of a failure in oscillator circuit 1. When the output of frequency divider 7 remains in the logic high state for too long of a period of time (due to signal OSC oscillating at too low of a frequency or not oscillating at all), capacitor 41 charges to a voltage in excess of the input switching voltage of logic gate 45, which causes the output of logic gate 45 and hence output signal OUT to change state. Similarly, when the output of frequency divider 7 remains in the logic low state for too long of a period of time (due to signal OSC oscillating at too low of a frequency or not oscillating at all), capacitor 51 charges to a voltage in excess of the input switching voltage of logic gate 55, which causes the output of logic gate 55 and hence output signal OUT to change state. In this way, logic low detect circuit 4 and logic high detect circuit 5 serve as timing circuits to detect when the output of frequency divider 7 and hence signal OSC fail to oscillate as desired.

It is understood that detection circuitry 3 may have other circuit implementations. In particular, current sources 42 and 52 may serve to discharge the charge built up on capacitors 41 and 51, respectively, and transistors 44 and 45 may be pull-up transistors to selectively charge capacitors 41 and 51, respectively.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A detection circuit for detecting whether a signal is oscillating, comprising:
   first detect circuitry, comprising:
   at least one capacitive element;
   a first circuit for placing, at a first drive strength, a first voltage across the at least one capacitive element; and
   a second circuit for selectively placing, at a second drive strength greater than the first drive strength, a second voltage across the at least one capacitive element when activated, the second circuit being coupled to receive the signal and being activated based upon a value of the signal; and
   an output circuit having an input coupled to the capacitive element and having an output having a value based upon the voltage appearing across the capacitive element.

2. The detection circuit of claim 1, wherein the first voltage is a voltage representative a first logic value and the second voltage is a voltage representative of a second logic value.

3. The detection circuit of claim 1, wherein the first logic value is a logic high value and the second logic value is a logic low value.

4. The detection circuit of claim 1, wherein the first circuit comprises a current source for sourcing current to the at least one capacitive element.

5. The detection circuit of claim 4, wherein the current source comprises at least a portion of a current mirror having a first current leg and a second current leg coupled to the at least one capacitive element.

6. The detection circuit of claim 4, wherein the second circuit comprises a transistor coupled across the at least one capacitive element, a control terminal of the transistor being coupled to the signal.

7. The detection circuit of claim 6, wherein the transistor of the second circuit is sized larger than the size of transistors in the second current leg of the current mirror.

8. The detection circuit of claim 6, further comprising a third circuit for initially placing the second voltage across the at least one capacitive element when enabled.

9. The detection circuit of claim 1, wherein the second circuit comprises a Schmitt-trigger circuit having an input coupled to the at least one capacitive element and an output coupled to an input of the output circuit.

10. The detection circuit of claim 1, further comprising:
    second detect circuitry, comprising:
    at least one capacitive element;
    a first circuit for placing, at a third drive strength, one of the first and second voltages across the at least one capacitive element of the second detect circuitry; and
    a second circuit for selectively placing, at a fourth drive strength greater than the third drive strength, the other of the first and second voltages across the at least one capacitive element of the second detect circuitry when activated, the second circuit of the second detect circuitry being coupled to receive the signal and being activated based upon a value of the signal, the at least one capacitive element of the second detect circuitry being coupled to an input of the output circuit so that the output of the output circuit is based in part upon a voltage appearing across the at least one capacitive element of the second detect circuitry.

11. The detection circuit of claim 10, wherein the signal activates the second circuit of the first detect circuitry when in a first logic state and activates the second circuit of the second detect circuitry when in a second logic state different from the first logic state.

12. The detection circuit of claim 10, further comprising circuitry for initially placing the first voltage across both of the at least one capacitive elements when activated.

13. The detection circuit of claim 10, wherein the first drive strength is substantially the same as the third drive strength, and the second drive strength is substantially the same as the fourth drive strength.

14. A method for detecting whether a signal is oscillating between at least two logic states, comprising:
    initially placing a first voltage level across at least one first capacitive element;
    driving, with a first drive strength, a voltage appearing across the at least one first capacitive element towards a second voltage level;
    selectively driving, with a second drive strength greater than the first drive strength, the voltage across the at least one first capacitive element towards the first voltage level when the signal is in a first of the at least two logic states; and
    generating an output signal having a value based upon a voltage level across the at least one first capacitive element.

15. The method of claim 14, wherein the first voltage level corresponds to a logic low value and the second voltage level corresponds to a logic high value.

16. The method of claim 14, wherein the second voltage level corresponds to a logic low value and the first voltage level corresponds to a logic high value.

17. The method of claim 14, wherein the output signal switches between first and second logic states based upon the voltage appearing across the at least one first capacitive element relative to a predetermined voltage between the first voltage level and the second voltage level.

18. The method of claim 14, further comprising:
    initially placing a third voltage level across at least one second capacitive element;
    driving, with a third drive strength, a voltage appearing across the at least one second capacitive element towards a fourth voltage level;
    selectively driving, with a fourth drive strength greater than the third drive strength, the voltage across the at least one second capacitive element towards the third voltage level when the signal is in a second of the at least two logic states, wherein the output signal has a value based upon a voltage level across the at least one second capacitive element.

19. The method of claim 18, wherein the first voltage level is approximately equal to the third voltage level and the second voltage level is approximately equal to the fourth voltage level.

20. The method of claim 18, wherein the first voltage level is approximately equal to the fourth voltage level and the second voltage level is approximately equal to the third voltage level.

21. The method of claim 18, wherein the third drive strength is substantially the same as the first drive strength, and the fourth drive strength is substantially the same as the second drive strength.

22. An apparatus, comprising: a first circuit having an input coupled to the output signal of the first circuit; a second circuit detecting whether the output signal of the first circuit oscillates at a frequency that is less than a predetermined frequency by determining whether the output signal remains in one of a first or second logic state in excess of a predetermined period of time; a charging circuit that charges a capacitor in response to the output signal being in one of the first or second logic states; a discharging circuit that discharges the capacitor in response to transition of the output signal to the other of the first or second logic states: and a capacitor voltage detection circuit measuring a voltage stored on the capacitor, the measured voltage being indicative of whether the output signal remains in one of a first or second logic state in excess of a predetermined period of time.

23. An apparatus, comprising:
a first circuit that generates an output signal; and
a second circuit having an input coupled to the output signal of the first circuit the second circuit detecting whether the output signal of the first circuit oscillates at a frequency that is less than a predetermined frequency the second circuit capable of determining whether the output signal of the first circuit remains in a first logic state for at least a predetermined period of time or in a second logic state for at least the predetermined period of time;
wherein the second circuit comprises:
a first capacitive element;
a third circuit for charging the first capacitive element towards a first voltage level;
a fourth circuit for selectively charging the first capacitive element towards a second voltage level at a drive strength greater than a drive strength at which the third circuit charges the first capacitive element, the fourth circuit being activated when the output signal of the first circuit is in the first logic state; and
a fifth circuit having an input coupled to the first capacitive element for generating an output signal having a value dependent upon the voltage appearing across the first capacitive element.

24. The apparatus of claim 23, wherein the first voltage level corresponds to a logic low state and the second voltage level corresponds to a logic high state.

25. The apparatus of claim 23, wherein the first voltage level corresponds to a logic high state and the second voltage level corresponds to a logic low state.

26. The apparatus of claim 23, further comprising:
a second capacitive element;
a sixth circuit for charging the second capacitive element towards a third voltage level;
a seventh circuit for selectively charging the second capacitive element towards a fourth voltage level at a drive strength greater than a drive strength at which the sixth circuit charges the second capacitive element, the seventh circuit being activated when the output signal of the first circuit is in the second logic state, the value of the output signal of the fifth circuit being based upon the voltage level appearing across the second capacitive element.

27. The apparatus of claim 26, wherein the first voltage level is substantially the same as the third voltage level and the second voltage level is substantially the same as the fourth voltage level.

28. The apparatus of claim 26, wherein the first voltage level is substantially the same as the fourth voltage level and the second voltage level is substantially the same as the third voltage level.

29. The apparatus of claim 26, wherein the sixth circuit comprises at least a portion of a current mirror.

30. The apparatus of claim 23, wherein the third circuit comprises at least a portion of a current mirror.

31. The apparatus of claim 23, wherein the first voltage level corresponds to a logic high state and the second voltage level corresponds to a logic low state.

32. The apparatus of claim 22,
wherein the charging circuit comprises:
a capacitive element; and
a current source for charging the capacitive element towards a first reference voltage; and
wherein the discharging circuit comprises:
a switching circuit for selectively discharging the capacitive element towards a second reference voltage, the switching circuit being activated in response to output signal transition.

33. The apparatus of claim 32, wherein the first reference voltage level corresponds to a logic low state and the second reference voltage level corresponds to a logic high state.

* * * * *